(12) United States Patent
Sugie

(10) Patent No.: US 12,470,212 B2
(45) Date of Patent: Nov. 11, 2025

(54) DRIVE CIRCUIT FOR BRIDGE CIRCUIT, MOTOR DRIVE DEVICE USING THE SAME, AND ELECTRONIC DEVICE

(71) Applicant: ROHM Co., LTD., Kyoto (JP)

(72) Inventor: Hisashi Sugie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 37 days.

(21) Appl. No.: 18/419,770

(22) Filed: Jan. 23, 2024

(65) Prior Publication Data

US 2024/0259017 A1 Aug. 1, 2024

(30) Foreign Application Priority Data

Jan. 30, 2023 (JP) ................................ 2023-012061

(51) Int. Cl.
*H03K 17/687* (2006.01)
*H03K 17/06* (2006.01)

(52) U.S. Cl.
CPC ....... *H03K 17/6871* (2013.01); *H03K 17/063* (2013.01); *H03K 2217/0063* (2013.01); *H03K 2217/0072* (2013.01)

(58) Field of Classification Search
CPC ............. H03K 17/6871; H03K 17/063; H03K 2217/0063; H03K 2217/0072
See application file for complete search history.

(56) References Cited

U.S. PATENT DOCUMENTS

2024/0291477 A1\* 8/2024 Fukuda .................. H03K 17/08

FOREIGN PATENT DOCUMENTS

WO WO2022259780 12/2022

\* cited by examiner

*Primary Examiner* — Metasebia T Retebo
(74) *Attorney, Agent, or Firm* — CHIP LAW GROUP

(57) ABSTRACT

Provided is a drive circuit for driving a bridge circuit having a high-side transistor connected between an input line and an output line and a low-side transistor connected between the output line and a ground line. The drive circuit includes an output monitoring circuit that compares an output voltage generated on the output line with a threshold level based on an input voltage of the input line and generates an output detection signal indicating a comparative result. The output monitoring circuit includes a first transistor, a clamp element, a second transistor, a first resistor, a capacitor. The output detection signal is responsive to a signal at the drain of the second transistor.

6 Claims, 8 Drawing Sheets

DRIVE CIRCUIT FOR BRIDGE CIRCUIT, MOTOR DRIVE DEVICE USING THE SAME, AND ELECTRONIC DEVICE

CROSS REFERENCE TO RELATED APPLICATIONS

This application claims priority benefit of Japanese Patent Application No. JP 2023-012061 filed in the Japan Patent Office on Jan. 30, 2023. Each of the above-referenced applications is hereby incorporated herein by reference in its entirety.

BACKGROUND

The present disclosure relates to a drive circuit for a bridge circuit.

Half-bridge circuits, H-bridge circuits, and three-phase bridge circuits (hereinafter collectively referred to as bridge circuits) using power transistors are often used in motor driver circuits, direct current/direct current (DC/DC) converters, power conversion devices, and other devices.

The bridge circuit includes an upper arm provided between an input line IN and an output line OUT, and a lower arm provided between the output line OUT and a ground line. The upper arm includes a high-side transistor and a flywheel diode connected in parallel. The lower arm includes a low-side transistor and a flywheel diode connected in parallel.

The bridge circuit can be switched between a high output state in which the high side transistor is on and the low side transistor is off, and a low output state in which the high side transistor is off and the low side transistor is on. In the high output state, an output voltage $V_{OUT}$ at substantially the same voltage level as an input line voltage $V_{IN}$ is generated on the output line OUT. In the low output state, the output voltage $V_{OUT}$ at substantially the same voltage level as the voltage on the ground line is generated on the output line OUT.

When a high-side transistor and a low-side transistor are turned on simultaneously during a transition between a high output state and a low output state, an undesirable shoot-through current flows. To prevent this, the bridge circuit passes through a high impedance state in which both the high-side transistor and the low-side transistor are off, during the transition between the high output state and the low output state. The period during which this bridge circuit is in a high impedance state is called dead time.

An example of the related art is disclosed in PCT Patent Publication No. WO2022/259780.

DETAILED DESCRIPTION

General Description of Embodiments

Figure 1:
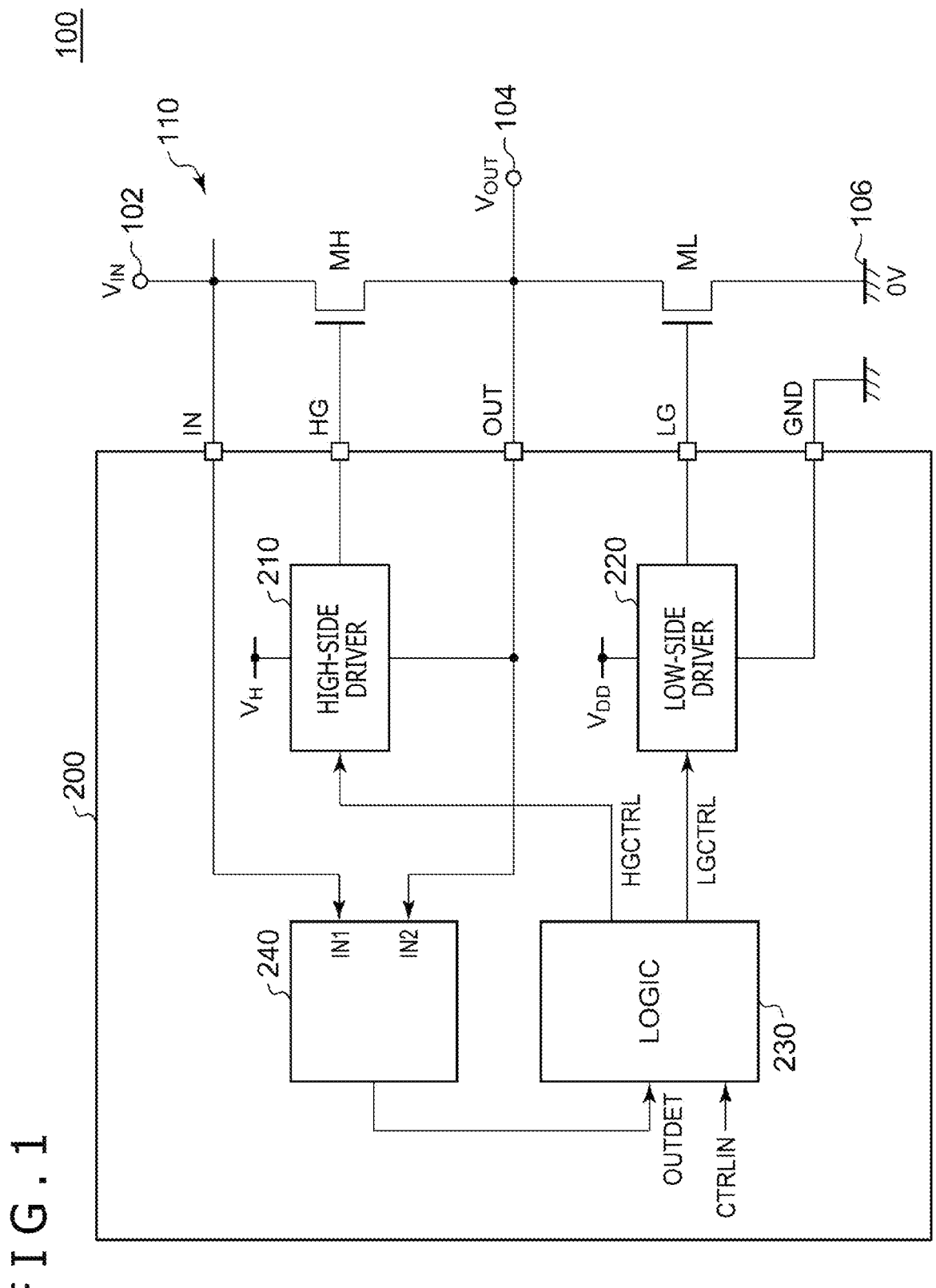
FIG. 1 is a circuit diagram of a switching circuit according to an embodiment.

A general description of some exemplary embodiments of the present disclosure will be described. This general description is intended to provide a simplified description of some concepts of one or more embodiments in order to provide a basic understanding of the embodiments, as a prelude to the more detailed description that will be presented later, and does not limit the size of the disclosure. This general description is not a comprehensive overview of all embodiments that can be considered and is not intended to specify key elements of all embodiments or to delineate the scope of any or all aspects. For convenience, "an embodiment" may be used to refer to one embodiment (example or modification) or a plurality of embodiments (examples or modifications) disclosed in the present specification.

A drive circuit according to an embodiment drives a bridge circuit having a high-side transistor connected between an input line and an output line and a low-side transistor connected between the output line and a ground line. The drive circuit includes an output monitoring circuit that compares the output voltage generated on the output line with a threshold level based on the input voltage of the input line and generates an output detection signal indicating the comparative result. The output monitoring circuit includes a first transistor whose drain is connected to the input line and whose gate is subjected to application of a reference voltage higher than the output voltage by a predetermined voltage width, a clamp element connected between a source of the first transistor and the output line, a second transistor whose gate is connected to a source of the first transistor and whose source is connected to the output line, a first resistor whose first end receives the reference voltage and whose second end is connected to a drain of the second transistor, and a capacitor connected between the input line and the gate of the second transistor, and the output detection signal is responsive to the signal at the drain of the second transistor.

According to this configuration, since the voltage transition width at the drain of the second transistor is small, high-speed detection is possible. Further, by providing the capacitor, when the output voltage sharply lowers, the decrease of gate voltage of the second transistor due to such sharp lowering can be suppressed, and the detection delay of the output monitoring circuit can be reduced.

In an embodiment, the clamp element may include a diode having a cathode connected to the gate of the second transistor and an anode connected to the output line.

In an embodiment, the drive circuit may further include a high-side driver that drives the high-side transistor according to a high-side control signal, a low-side driver that drives the low-side transistor according to a low-side control signal, and a logic circuit that generates the high-side control signal and the low-side control signal according to at least the input signal and the output detection signal.

In an embodiment, the low-side driver may include a first current source that passes a charging current as a source current to a gate of the low-side transistor and a second current source that passes a discharge current as a sink current from the gate of the low-side transistor. The first current source may switch the charging current in three stages. The drive circuit may further include a high-side sensor that compares the gate-source voltage of the high-side transistor with a predetermined threshold level, and a low-side sensor that compares the gate-source voltage of the low-side transistor with a predetermined threshold level. The logic circuit may set the charging current as a first current amount during the first period after the input signal transitions and until the output of the high-side sensor changes, set the charging current as a second current amount smaller than a first current amount during a second period after the output of the high-side sensor changes and until the output detection signal changes, and set the charging current to a third current amount larger than the first current amount and the second current amount during a third period after the output detection signal changes. As a result, the low-side transistor can be turned on in a short time while the influence of the reverse recovery current flowing through the body diode of the high-side transistor is reduced.

A motor drive device according to an embodiment may include a bridge circuit including a high-side transistor and a low-side transistor, and any of the above-mentioned drive circuits that drive the bridge circuit.

An electronic device according to an embodiment may include a motor and the above-described motor drive device that drives the motor.

Embodiments

Hereinafter, preferred embodiments will be described with reference to the drawings. Identical or equivalent components, members, and processes illustrated in each drawing are denoted by the same reference signs, and redundant explanations will be omitted as appropriate. Furthermore, the embodiments are illustrative without limiting the disclosure, and all features and combinations thereof described in the embodiments are not necessarily essential to the disclosure.

In the present specification, "a state in which member A is connected to member B" refers to not only a case in which member A and member B are physically and directly connected, but also cases in which member A and member B are indirectly connected via other members that do not substantially affect the electrical connection state thereof or do not impair the functions and effects achieved by their combination.

Similarly, "a state in which member C is provided between member A and member B" refers to not only the case where member A and member C or member B and member C are directly connected, but also cases in which they are indirectly connected via other members that do not substantially affect the electrical connection state thereof or do not impair the functions and effects achieved by their combination.

Note that the vertical and horizontal axes of waveform diagrams and time charts referred to in the present specification have been enlarged or reduced as appropriate for ease of understanding, and each illustrated waveform has also been simplified, exaggerated, or emphasized for ease of understanding.

FIG. 1 is a circuit diagram of a switching circuit 100 according to an embodiment. The switching circuit 100 includes a bridge circuit 110 and a drive circuit 200. Although only the configuration for one phase of the switching circuit 100 is illustrated here, the switching circuit 100 may be a three-phase circuit or an H-bridge circuit.

An input line 102 is supplied with an input voltage $V_{IN}$. The bridge circuit 110 includes a high-side transistor MH connected between an input line (input terminal) 102 and an output line (output terminal) 104, and a low-side transistor ML connected between the output line 104 and a ground line 106. The high-side transistor MH and the low-side transistor ML are N-channel transistors.

The drive circuit 200 controls the high-side transistor MH and the low-side transistor ML of the bridge circuit 110. The drive circuit 200 switches between two states, namely a high output state $\varphi$ in which the high-side transistor MH is on and the low-side transistor ML is off, and a low output state $\varphi_L$ in which the high-side transistor MH is off and the low-side transistor ML is on. The bridge circuit 110 may take a high impedance state $\varphi_{HZ}$ in which both the high-side transistor MH and the low-side transistor ML are off. In the high output state $\varphi_H$, the output voltage $V_{OUT}$ generated on the output line 104 has a voltage level substantially equal to the input voltage $V_{IN}$. In the low output state $\varphi_L$, the output voltage $V_{OUT}$ has a voltage $L_{OUT}$ level substantially equal to the ground voltage (0V).

The drive circuit 200 is a functional integrated circuit (IC) that includes a high-side driver 210, a low-side driver 220, a logic circuit 230, and an output monitoring circuit 240, and is integrated on one semiconductor substrate. An input pin IN of the drive circuit 200 is connected to the input line 102, and an output pin OUT is connected to the output line 104. A ground pin GND is grounded. A high-side gate pin HG is connected to the gate of the high-side transistor MH, and a low-side gate pin LG is connected to the gate of the low-side transistor ML.

The high-side driver 210 drives the high-side transistor MH according to a high-side control signal HGCTRL. The low-side driver 220 drives the low-side transistor ML according to a low-side control signal LGCTRL. The high-side driver 210 is supplied with a high voltage $V_H$ that is higher than the output voltage $V_{OUT}$ by a predetermined voltage width (for example, 5V).

The output monitoring circuit 240 is connected to the input pin IN and the output pin OUT, and receives the input voltage $V_{IN}$ and the output voltage $V_{OUT}$. The output monitoring circuit 240 compares the output voltage $V_{OUT}$ with a threshold level $V_{TH}$ based on the input voltage $V_{IN}$ and outputs an output detection signal OUTDET indicating the comparative result between $V_{OUT}$ and $V_{TH}$. The output detection signal OUTDET is a binary signal that takes a first level (hereinafter referred to as high) when $V_{OUT} > V_{TH}$, and a second level (hereinafter referred to as low) when $V_{OUT} < V_{TH}$.

The logic circuit 230 receives at least a control input CTRLIN and the output detection signal OUTDET. The logic circuit 230 generates the high-side control signal HGCTRL and the low-side control signal LGCTRL on the basis of the control input CTRLIN and the output detection signal OUTDET. The output detection signal OUTDET may be used only to generate the high-side control signal HGCTRL, may be used only to generate the low-side control signal LGCTRL, or may be used to generate both.

The above is the configuration of the drive circuit 200 and the switching circuit 100. Next, the configuration of the output monitoring circuit 240 will be described.

Figure 2:
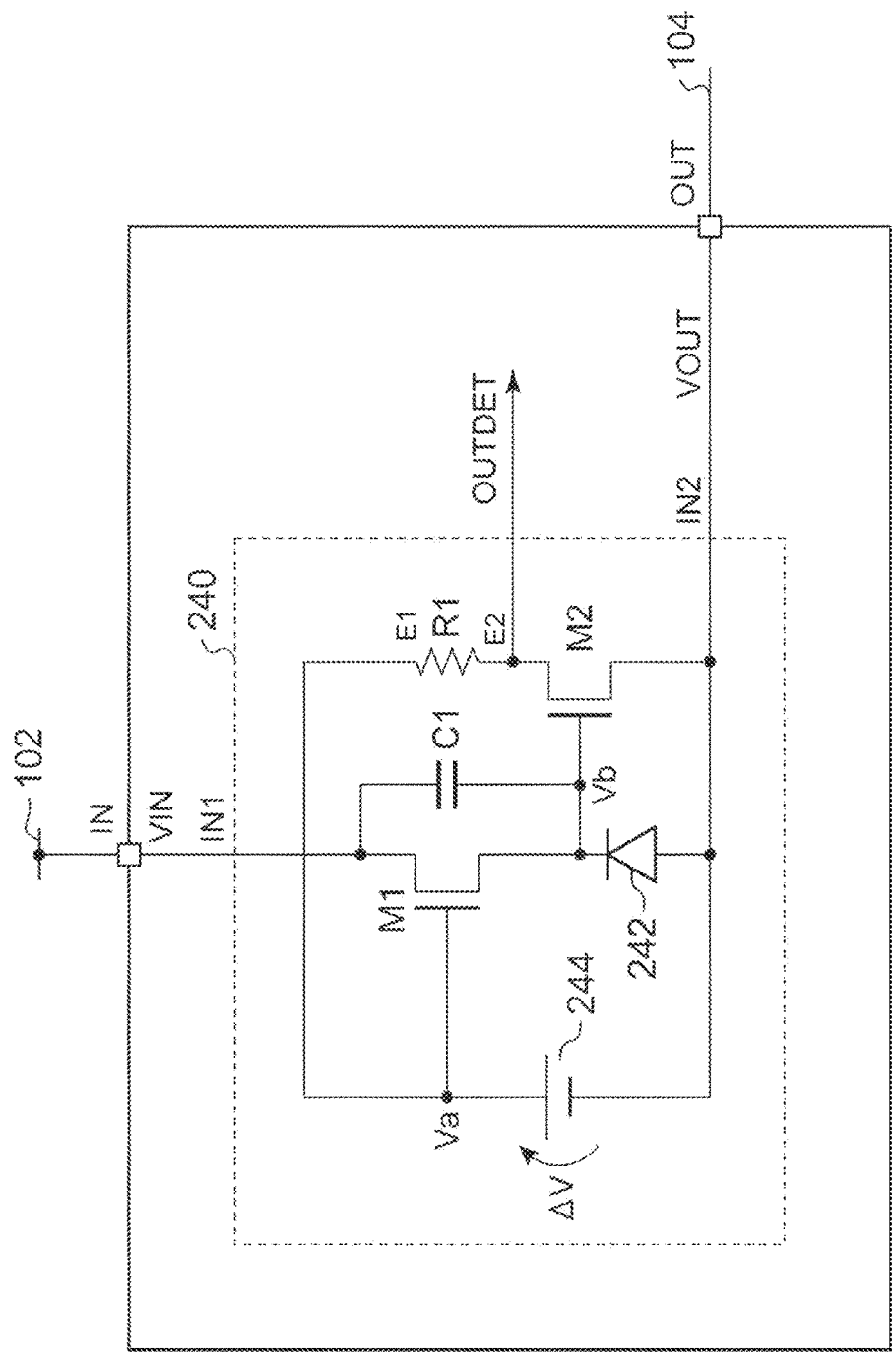
FIG. 2 is a circuit diagram of an output monitoring circuit according to the embodiment.

FIG. 2 is a circuit diagram of the output monitoring circuit 240 according to the embodiment. The output monitoring circuit 240 includes a first transistor M1, a second transistor M2, a capacitor C1, a resistor R1, a clamp element 242, and a voltage source 244.

A first input IN1 of the output monitoring circuit 240 is connected to the input pin IN and is supplied with the input voltage $V_{IN}$. Further, a second input IN2 of the output monitoring circuit 240 is connected to the output pin OUT and is supplied with the output voltage $V_{OUT}$.

The voltage source 244 generates a reference voltage Va higher than the output voltage $V_{OUT}$ by a predetermined voltage width ΔV. The first transistor M1 has a drain connected to the input pin IN (input line 102), and the reference voltage Va higher than the output voltage $V_{OUT}$ by the predetermined voltage width ΔV is applied to the gate.

The clamp element 242 is connected between a source of the first transistor M1 and the output pin OUT (output line 104). The second transistor M2 has a gate connected to the source of the first transistor M1, and a source connected to the output pin OUT (output line 104). For the clamp element 242, a diode whose cathode is connected to the gate of the second transistor M2 and whose anode is connected to the output line 104 can be used.

The resistor R1 receives the reference voltage Va at a first end E1 and has a second end E2 connected to a drain of the second transistor M2. The capacitor C1 is connected between the input line 102 and the gate of the second transistor M2.

The output monitoring circuit 240 outputs the output detection signal OUTDET according to the signal at the drain of the second transistor M2.

The above is the configuration of the output monitoring circuit 240. Next, its operation will be described.

It is assumed that the gate voltage of the first transistor M1 is Va, and the gate voltage of the second transistor M2 is Vb. Since Va>Vb is satisfied and the first transistor M1 has been fully turned on, Vb≈$V_{IN}$ is satisfied. That is, the gate-source voltage of the second transistor M2 is $V_{IN}-V_{OUT}$.

When the output voltage $V_{OUT}$ is high, the potential difference between the input voltage $V_{IN}$ and the output voltage $V_{OUT}$ is smaller than the gate threshold voltage $V_{GS(th)}$ of the second transistor M2. Therefore, the second transistor M2 is off, and the output detection signal OUTDET becomes high (Va).

When the output voltage $V_{OUT}$ decreases, the potential difference between the input voltage $V_{IN}$ and the output voltage $V_{OUT}$ exceeds the gate threshold voltage $V_{GS(th)}$ of the second transistor M2, and the second transistor M2 is turned on. At this time, the output detection signal OUTDET becomes low (V).

The above is the operation of the output monitoring circuit 240. In this way, the output monitoring circuit 240 can generate the output detection signal OUTDET, which is high when $V_{OUT}>V_{TH}$ and low when $V_{OUT}<V_{TH}$.

The advantages of the output monitoring circuit 240 become clearer when contrasted with comparative techniques.

Figure 3:
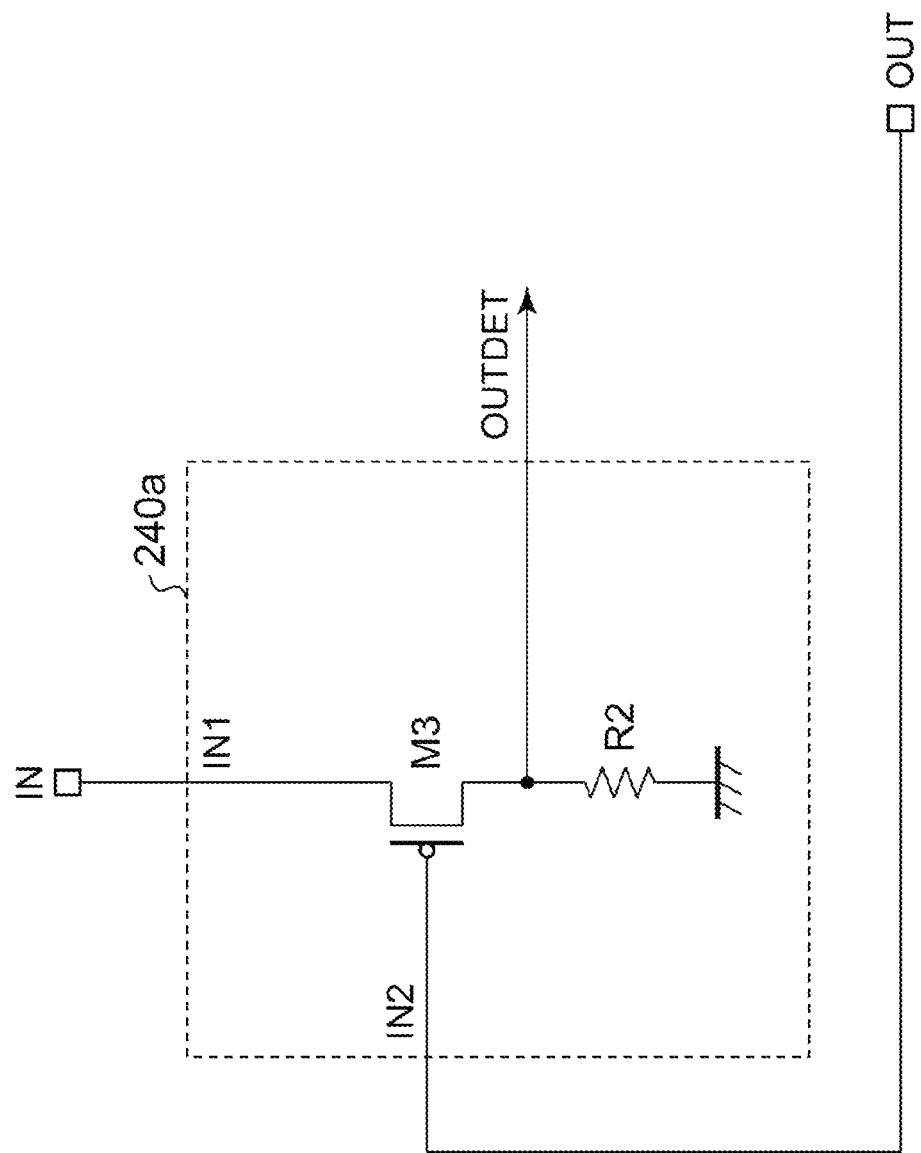
FIG. 3 is a circuit diagram of an output monitoring circuit according to Comparative technique 1.

FIG. 3 is a circuit diagram of an output monitoring circuit 240a according to Comparative technique 1. The output monitoring circuit 240a includes a third transistor M3 which is a positive-channel metal oxide semiconductor (PMOS) transistor and a resistor R2 connected in series between the input pin IN and the ground. The output voltage $V_{OUT}$ is applied to the gate of the third transistor M3, and the signal at the source of the third transistor M3 becomes the output detection signal OUTDET.

The configuration illustrated in FIG. 3 has a problem that power consumption is large. Furthermore, since the output detection signal OUTDET transitions between the input voltage $V_{IN}$ and the ground voltage (0V), there is a problem that the detection speed is slow.

The output monitoring circuit 240 in FIG. 2 can reduce power consumption compared to the configuration in FIG. 3. In addition, the output monitoring circuit 240 in FIG. 2 has a small potential difference between the high level and low level of the output detection signal OUTDET, and thus, the detection speed is fast.

Figure 4:
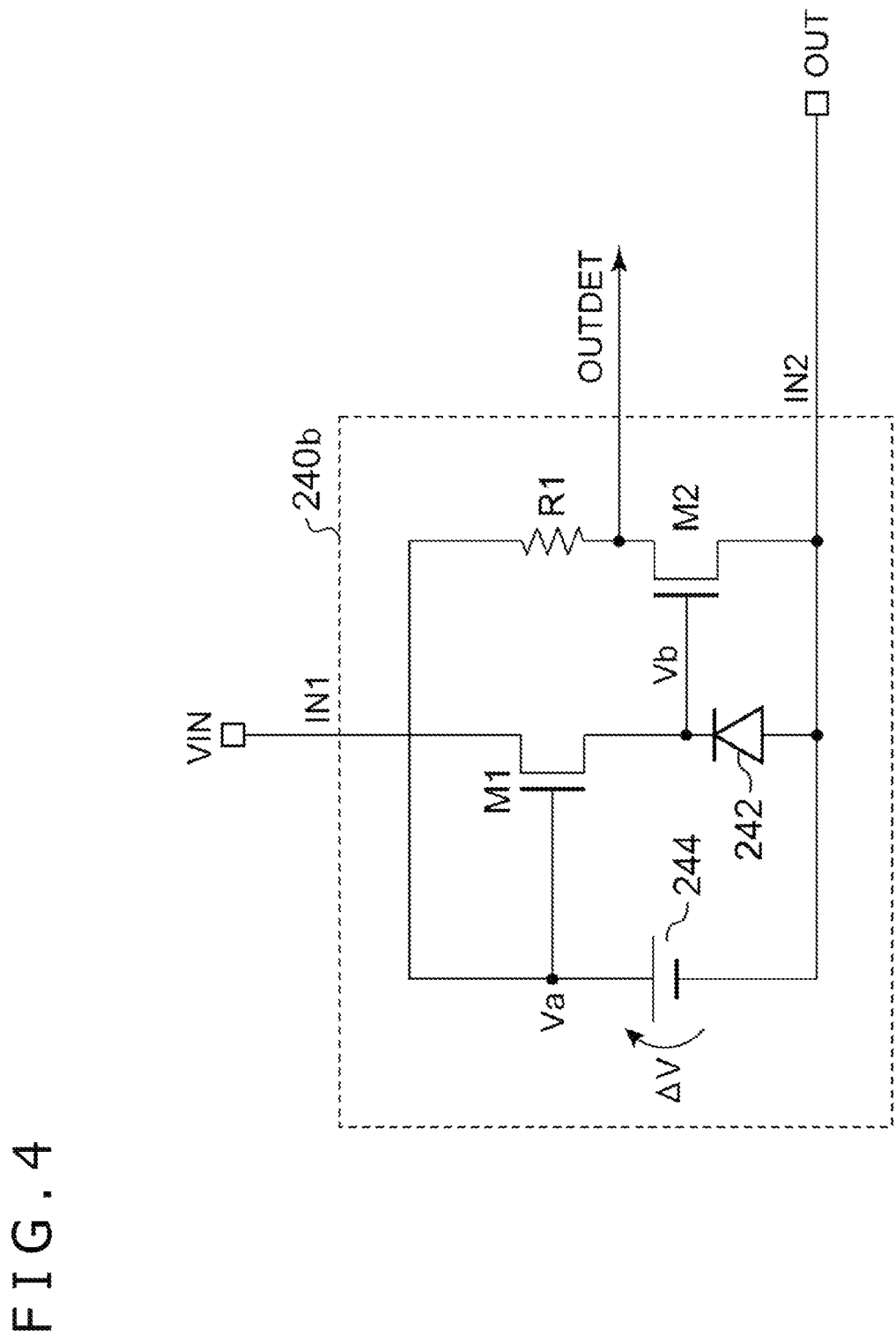
FIG. 4 is a circuit diagram of an output monitoring circuit according to Comparative technique 2.

FIG. 4 is a circuit diagram of an output monitoring circuit 240b according to Comparative technique 2. The output monitoring circuit 240b is illustrated with the capacitor C1 omitted from the output monitoring circuit 240 in FIG. 2. The output monitoring circuit 240b in FIG. 4 also consumes less power and has faster detection speed than the output monitoring circuit 240a in FIG. 3. However, the output monitoring circuit 240b of FIG. 4 has the following drawbacks.

Figure 5:
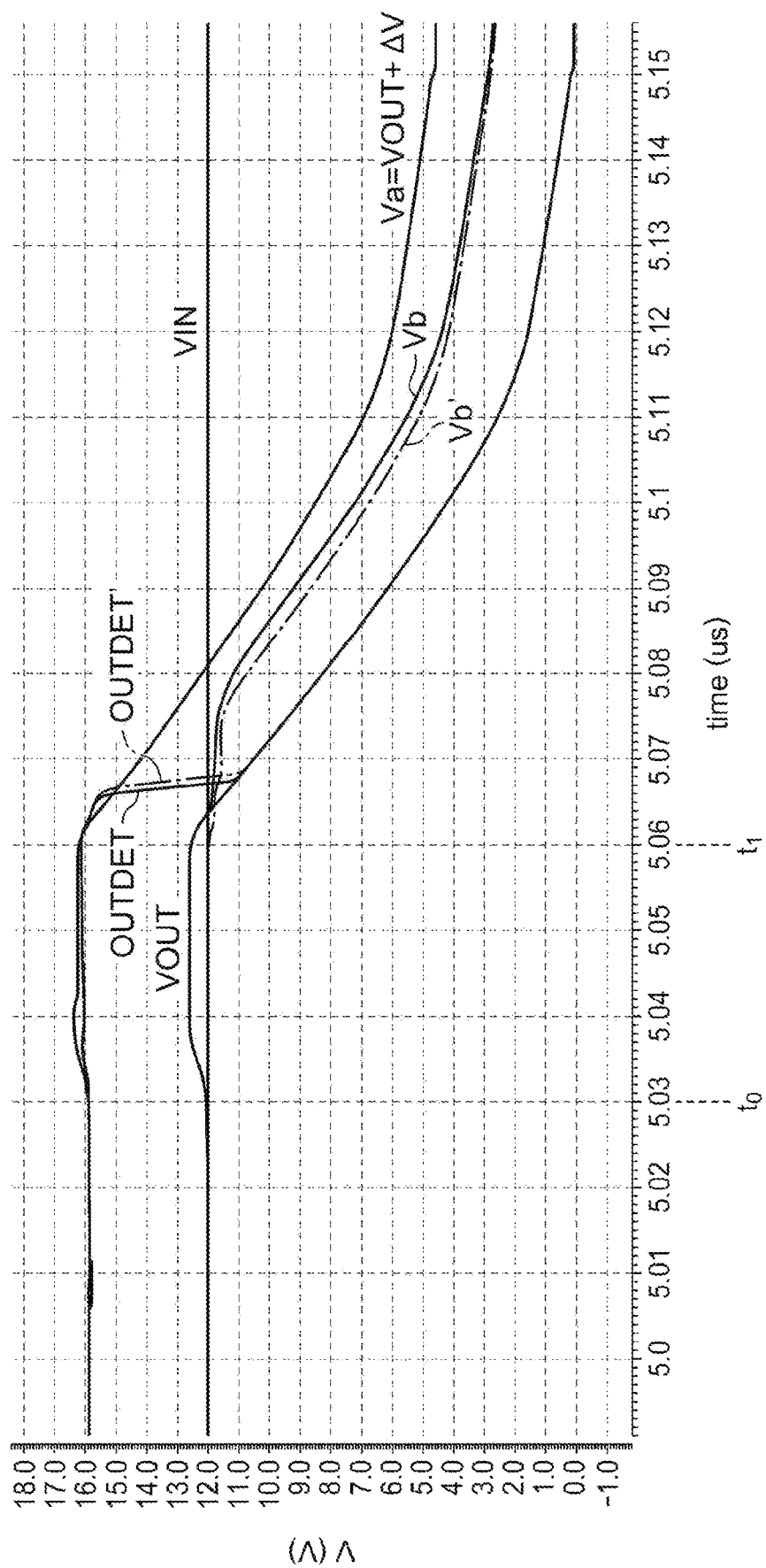
FIG. 5 is a diagram illustrating the operations of the output monitoring circuit according to the embodiment and the output monitoring circuit according to Comparative technique 2.

FIG. 5 is a diagram illustrating the operations of the output monitoring circuit 240 according to the embodiment and the output monitoring circuit 240b according to Comparative technique 2. The voltage Vb and the output detection signal OUTDET in the output monitoring circuit 240 are illustrated by solid lines. Further, a voltage Vb' and an output detection signal OUTDET' in the output monitoring circuit 240b are illustrated by dashed-dotted lines. The output voltage $V_{OUT}$, the reference voltage Va, and the input voltage $V_{IN}$ are common. $V_{IN}$=12V and ΔV=5V are satisfied. In the (sink) state of absorbing current, how the output voltage $V_{OUT}$ is transitioning from high to low is illustrated.

Before time t0, the high-side transistor MH is on, the low-side transistor ML is off, and $V_{OUT}=V_{IN}$ is satisfied.

At time t0, the high-side transistor MH is turned off, and a dead time begins in which both the high-side transistor MH and the low-side transistor ML are off. During the dead time, the output current flows to the body diode of the high-side transistor MH, and the output voltage $V_{OUT}$ becomes $V_{IN}$+Vf. Vf is the forward voltage of the body diode.

At time $t_1$, when the turn-on operation of the low-side transistor ML starts, the output voltage $V_{OUT}$ starts to decrease.

In the output monitoring circuit 240b in FIG. 4, when the output voltage $V_{OUT}$ decreases sharply, the gate voltage Vb' of the second transistor M2 decreases due to being affected by the output voltage $V_{OUT}$. Therefore, the timing at which the second transistor M2 turns on is delayed, and the timing at which the output detection signal OUTDET' transitions is delayed. This is a drawback of the output monitoring circuit 240b.

On the other hand, in the output monitoring circuit 240 in FIG. 2, since the capacitor C1 is connected between the drain and the source of the first transistor M1, when the output voltage $V_{OUT}$ transitions, the potential of the gate voltage Vb of the second transistor M2 is maintained without being affected by the output voltage $V_{OUT}$. As a result, compared to Comparative technique 2, the timing at which the second transistor M2 turns on becomes early, and the timing at which the output detection signal OUTDET' transitions becomes early. In this way, the output monitoring circuit 240 according to the embodiment has the advantage that the detection speed is faster than the output monitoring circuit 240b according to Comparative technique 2.

Next, an example of control of the bridge circuit 110 using the output detection signal OUTDET of the output monitoring circuit 240 will be described.

Figure 6:
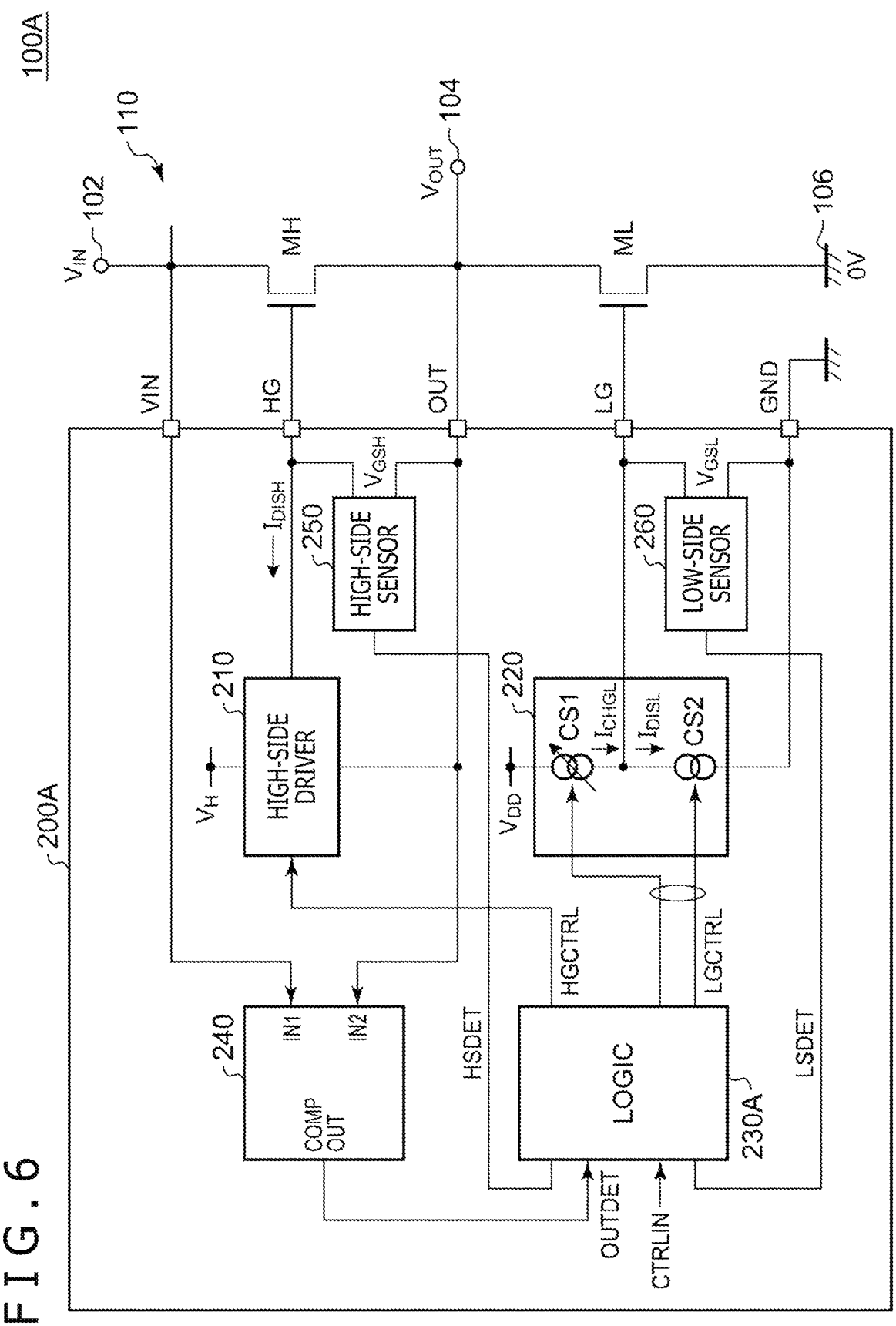
FIG. 6 is a circuit diagram of a switching circuit including a drive circuit according to an example.

FIG. 6 is a circuit diagram of a switching circuit 100A including a drive circuit 200A according to an embodiment. The drive circuit 200A includes the high-side driver 210, the low-side driver 220, a logic circuit 230A, the output monitoring circuit 240, a high-side sensor 250, and a low-side sensor 260.

The high-side sensor 250 compares a gate-source voltage $V_{GSH}$ of the high-side transistor MH with a predetermined threshold level $V_{THH}$. The threshold level V can be set near the gate-source threshold $V_{TH(GS)}$ of the high-side transistor MH. A high-side detection signal HSDET, which is the output of the high-side sensor 250, is at the first level (for example, high) when $V_{GSH} > V_{THH}$, that is, when the high-side transistor MH is on, and is at the second level (for example, low) when $V_{GSH} < V_{THH}$, that is, when the high-side transistor MH is off.

The low-side sensor 260 compares a gate-source voltage $V_{GSL}$ of the low-side transistor ML with a predetermined threshold level $V_{THL}$. The threshold level $V_{THL}$ can be set near the gate-source threshold $V_{TH(GS)}$ of the low-side transistor ML. A low-side detection signal LSDET, which is the output of the low-side sensor 260, is at the first level (for example, high) when $V_{GSL} > V_{THL}$, that is, when the low-side transistor ML is on, and is at the second level (for example, low) when $V_{GSL} < V_{THL}$, that is, when the low-side transistor ML is off.

The logic circuit 230A controls the high-side driver 210 and the low-side driver 220 on the basis of the control input CTRLIN indicating a state of the output voltage $V_{OUT}$.

The logic circuit 230A generates the control signals HGCTRL and LGCTRL for the high-side driver 210 and the low-side driver 220 such that, when the control input CTRLIN is high, the high-side transistor MH is on, and the low-side transistor ML is off. Further, the logic circuit 230A also generates the control signals HGCTRL and LGCTRL for the high-side driver 210 and the low-side driver 220 such that, when the control input CTRLIN is low, the high-side transistor MH is off, and the low-side transistor ML is on.

The low-side driver 220 includes a first current source CS1 and a second current source CS2. The first current source CS1 and the second current source CS2 are complementarily enabled according to the control signal LGCTRL. The first current source CS1 is enabled when the low-side transistor ML is turned on, and generates a charging current $I_{CHGL}$. The second current source CS2 is enabled when the low-side transistor ML is turned on, and generates a discharge current $I_{DISL}$. The high-side driver 210 is also configured similarly to the low-side driver 220.

The first current source CS1 of the low-side driver 220 is a variable current source and is configured to be able to switch the charging current $I_{CHGL}$ to be supplied to the gate of the low-side transistor ML in three stages.

The control to be performed when the control input CTRLIN transitions from high to low will be described.

Figure 7:
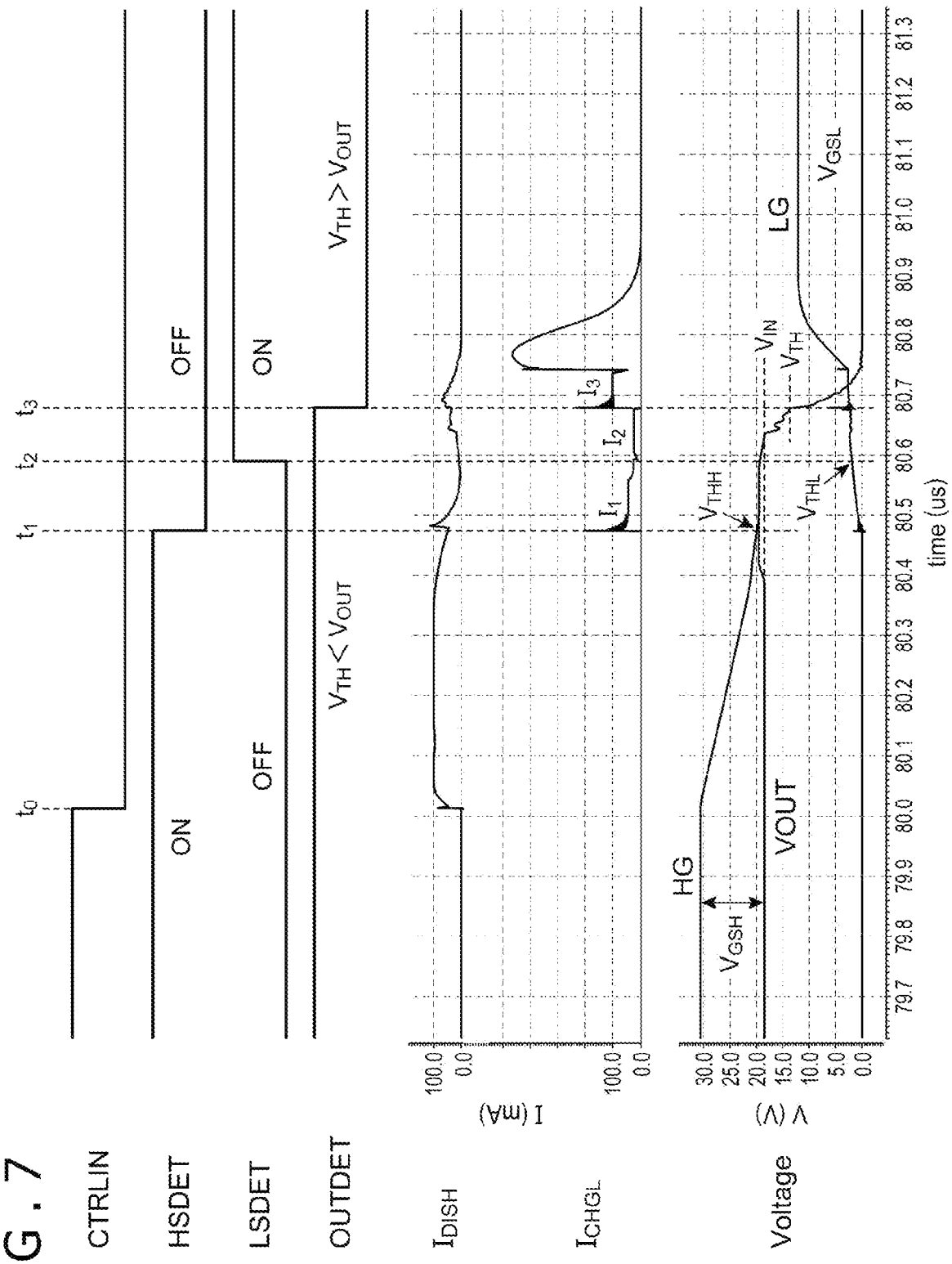
FIG. 7 is an operation waveform diagram of the switching circuit.

FIG. 7 is an operational waveform diagram of the switching circuit 100A. FIG. 7 illustrates a situation in which the output voltage $V_{OUT}$ transitions from high to low (sink fall) while the bridge circuit 110 is passing a sink current from the load.

When the control input CTRLIN changes from high to low at time t0, the logic circuit 230 controls the high-side driver 210 such that the gate-source voltage $V_{GSL}$ of the high-side transistor MH decreases. To be specific, the high-side driver 210 passes a constant discharge current $I_{DISH}$ as a sink current from the gate of the high-side transistor MH. As a result, the gate voltage HG of the high-side transistor MH decreases at a constant slope. The potential difference between the gate voltage HG of the high-side transistor MH and the output voltage $V_{OUT}$ is the gate-source voltage $V_{GSH}$ of the high-side transistor MH.

When the gate-source voltage $V_{GSH}$ of the high-side transistor MH becomes smaller than the threshold level $V_{THH}$ at time $t_1$, the high-side detection signal HSDET transitions.

In response to the transition of the high-side detection signal HSDET, that is, in response to the detection of turn-off of the high-side transistor MH, the logic circuit 230A controls the low-side driver 220 such that the low-side transistor ML is turned on. This prevents the high-side transistor MH and the low-side transistor ML from being turned on simultaneously.

The logic circuit 230A enables the first current source CS1 when the turn-off of the high-side sensor 250 is detected. The charging current $I_{CHGL}$ at this time is defined as a first current amount $I_1$. When the charging current $I_{CHGL}$ is supplied to the gate of the low-side transistor ML, a gate voltage LG rises at a constant slope. As a result, the low-side transistor ML gradually approaches the on-state, and the output voltage $V_{OUT}$ begins to decrease.

When the gate voltage LG exceeds the threshold level $V_{THL}$ at time $t_2$, the low-side detection signal LSDET transitions. In response to the transition of the low-side detection signal LSDET, the logic circuit 230A sets the charging current $I_{CHGL}$ to a second current amount $I_2$. The second current amount $I_2$ is set to be smaller than the first current amount $I_1$. This slows down the rate of increase in the gate voltage LG.

Immediately after time $t_2$, the low-side transistor ML has been weakly turned on, so that the output voltage $V_{OUT}$ gradually decreases. Then, when the output voltage $V_{OUT}$ becomes lower than the threshold level $V_{TH}$ based on the input voltage $V_{IN}$ at time $t_3$, the output detection signal OUTDET transitions.

By using the transition of the output detection signal OUTDET as a trigger, the logic circuit 230A sets the charging current $I_{CHGL}$ to a third current amount $I_3$. The third current amount $I_3$ is set to be larger than the first current amount $I_1$ and the second current amount $I_2$. After time $t_3$, the gate voltage LG of the low-side transistor ML rises sharply, and the on-resistance of the low-side transistor ML decreases. As a result, the slope of the output voltage $V_{OUT}$ increases.

In FIG. 7, during the period from time $t_1$ when the high-side transistor MH is turned off until time $t_2$ when the low-side transistor ML is turned on, the current absorbed by the bridge circuit 110 flows into the body diode (flywheel diode) of the high-side transistor MH. Then, immediately after time $t_2$, there is a possibility that a reverse recovery current flows through the flywheel diode of the high-side transistor MH. Therefore, between time $t_2$ and time $t_3$, the charging current $I_{CHGL}$ supplied to the gate of the low-side transistor ML is reduced in order to gradually turn on the low-side transistor ML. Then, by increasing the charging current $I_{CHGL}$ of the low-side transistor ML after the possibility that the reverse recovery current flows becomes low, the low-side transistor ML can be quickly turned on while the reverse recovery current is suppressed.

Here, if the response speed of the output monitoring circuit 240 is slow, the turn-on of the low-side transistor ML is delayed, but since the output monitoring circuit 240 according to the embodiment operates fast as described above, the low-side transistor ML can be quickly turned on.

Note that the use of the output of the output monitoring circuit 240 is not limited to that described with reference to FIGS. 6 and 7.

Next, the use application of the switching circuit 100 will be described. The switching circuit 100 can be suitably used in a motor drive circuit.

Figure 8:
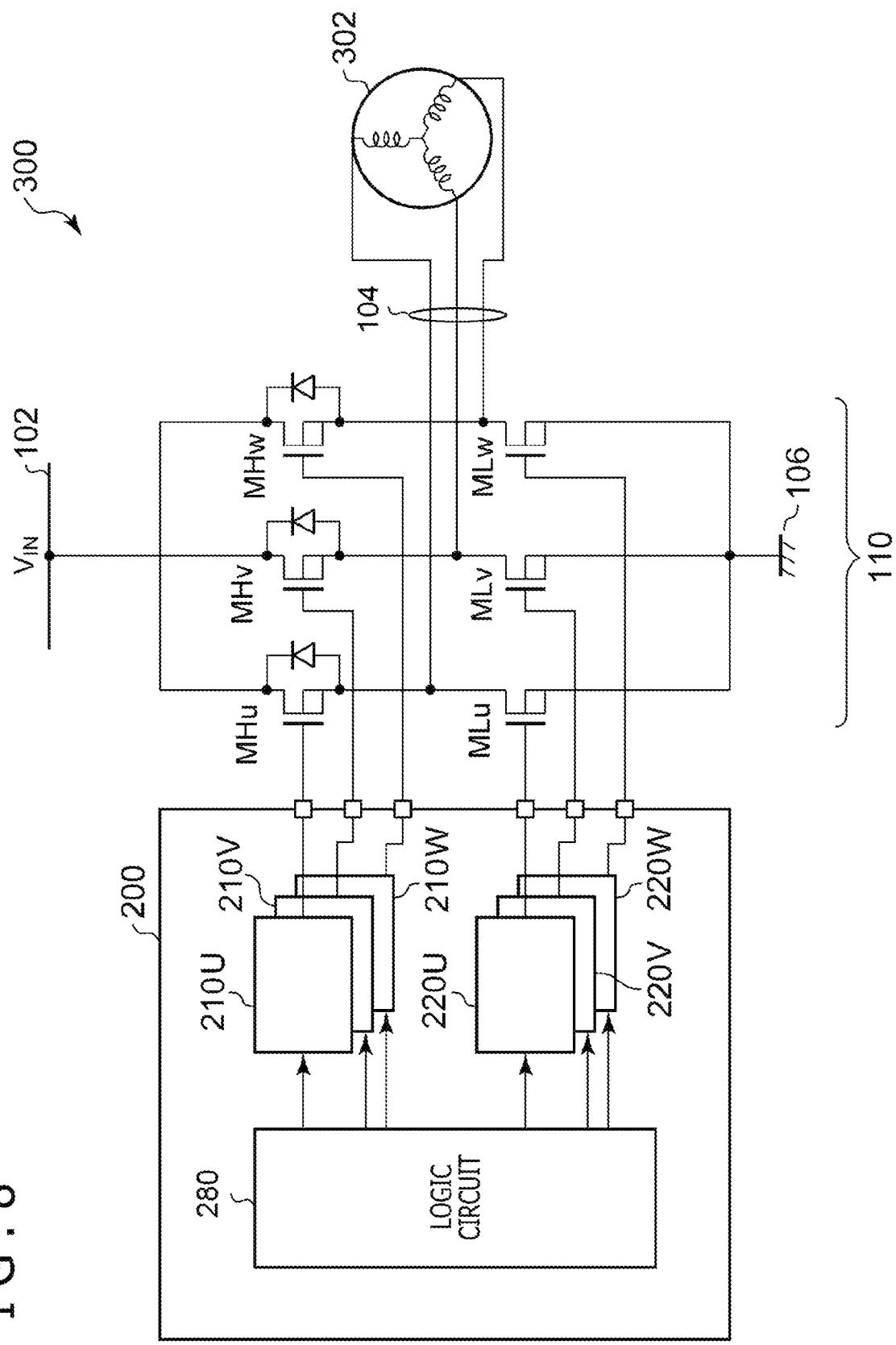
FIG. 8 is a circuit diagram of a motor drive device including a switching circuit according to the embodiment.

FIG. 8 is a circuit diagram of a motor drive device 300 including the switching circuit 100 according to the embodiment. The motor drive device 300 drives a three-phase motor 302, which is a load, and controls the rotation state.

The motor drive device 300 includes the bridge circuit 110 and the drive circuit 200. The bridge circuit 110 is a three-phase inverter and has U-phase, V-phase, and W-phase legs, and each phase leg has an upper arm and a lower arm.

The drive circuit 200 includes high-side drivers 210U to 210W, low side drivers 220U to 220W, and a control circuit 280. In addition to the logic circuit 230 in FIG. 1, the control circuit 280 includes a feedback circuit that performs feedback control such that the state of the three-phase motor 302 approaches a target state, and generates control signals indicating the states of six arms that constitute the bridge circuit 110.

Although a three-phase motor is used as an example here, a single-phase motor may also be used. In this case, the bridge circuit 110 becomes an H-bridge circuit.

Next, the use application of the motor drive device 300 will be described. The motor drive device 300 can be used to control a spindle motor of a hard disk and a lens drive motor of an imaging device. Alternatively, it can be used to drive a printer head drive motor or a paper feed motor. Alternatively, the motor drive device 300 can be used to drive a motor of an electric vehicle, a hybrid vehicle, or other vehicles.

Those skilled in the art will understand that the embodiments are merely illustrative, that various modifications can be made to the combinations of their constituent elements and processing processes, and that such modifications are also within the scope of the present disclosure. Hereinafter, such modification examples will be described.

(Modification 1)

In the embodiment, the bridge circuit 110 is constituted by discrete components, but the present disclosure is not limited to this, and the bridge circuit 110 may be integrated into the drive circuit 200.

(Modification 2)

The high-side transistor MH and the low-side transistor ML may be configured with insulated gate bipolar transistors (IGBTs).

(Modification 3)

The use application of the switching circuit 100 is not limited to the motor drive device 300. For example, the switching circuit 100 can be suitably used in switching regulators (DC/DC converters), various power conversion devices (inverters and converters), inverters for lighting electric-discharge lamps, digital audio amplifiers, and other devices. Therefore, the switching circuit 100 can be used in consumer devices including electronic devices and home appliances, automobiles and in-vehicle components, industrial vehicles, and industrial machines.

The embodiments merely demonstrate the principles and applications of the present disclosure, and many modifications and changes in arrangement can be made to the embodiments without departing from the spirit of the present disclosure as defined in the claims.

(Additional Note)

The following techniques are disclosed in the present specification.

(Item 1)

A drive circuit for driving a bridge circuit having a high-side transistor connected between an input line and an output line and a low-side transistor connected between the output line and a ground line, the drive circuit including:

an output monitoring circuit that compares an output voltage generated on the output line with a threshold level based on an input voltage of the input line and generates an output detection signal indicating a comparative result, in which the output monitoring circuit includes a first transistor whose drain is connected to the input line and whose gate is subjected to application of a reference voltage higher than the output voltage by a predetermined voltage width, a clamp element connected between a source of the first transistor and the output line, a second transistor whose gate is connected to a source of the first transistor and whose source is connected to the output line, a first resistor whose first end receives the reference voltage and whose second end is connected to a drain of the second transistor, and a capacitor connected between the input line and the gate of the second transistor, and the output detection signal is responsive to a signal at the drain of the second transistor.

(Item 2)

The drive circuit according to item 1, in which the clamp element includes a diode whose cathode is connected to the gate of the second transistor and whose anode is connected to the output line.

(Item 3)

The drive circuit according to item 1 or 2, further including:

a high-side driver that drives the high-side transistor in response to a high-side control signal;

a low-side driver that drives the low-side transistor in response to a low-side control signal; and a logic circuit that generates the high-side control signal and the low-side control signal in response to at least an input signal and the output detection signal.

(Item 4)

The drive circuit according to item 3, further including:

a high-side sensor that compares a gate-source voltage of the high-side transistor with a predetermined threshold level; and a low-side sensor that compares a gate-source voltage of the low-side transistor with a predetermined threshold level, in which the low side driver includes a first current source that serves as a source of a charging current to a gate of the low-side transistor, and a second current source that serves as a sink of a discharge current from the gate of the low-side transistor, the first current source switches the charging current in three stages, the logic circuit sets the charging current as a first current amount during a first period after the input signal transitions and until an output of the high-side sensor changes, the logic circuit sets the charging current as a second current amount smaller than the first current amount during a second period after the output of the high-side sensor changes and until the output detection signal changes, and the logic circuit sets the charging current as a third current amount larger than the first current amount and the second current amount during a third period after the output detection signal changes.

(Item 5)

A motor drive device including:
a bridge circuit including a high-side transistor and a low-side transistor; and
the drive circuit according to any one of items 1 to 4, which drives the bridge circuit.

(Item 6)

An electronic device including:
a motor; and
the motor drive device according to item 5, which drives the motor.

According to an aspect of the present disclosure, transitions in output voltage can be detected at high speed.

What is claimed is:

1. A drive circuit for driving a bridge circuit having a high-side transistor connected between an input line and an output line and a low-side transistor connected between the output line and a ground line, the drive circuit comprising:
an output monitoring circuit that compares an output voltage generated on the output line with a threshold level based on an input voltage of the input line and generates an output detection signal indicating a comparative result, wherein
the output monitoring circuit includes
a first transistor, wherein
the first transistor has a drain that is connected to the input line, and
the first transistor has a gate that is subjected to application of a reference voltage higher than the output voltage by a predetermined voltage width,
a clamp element connected between a source of the first transistor and the output line,
a second transistor, wherein
the second transistor has a gate that is connected to the source of the first transistor, and
the second transistor has a source that is connected to the output line,
a first resistor, wherein
the first resistor has a first end that receives the reference voltage, and
the first resistor has a second end that is connected to a drain of the second transistor, and
a capacitor connected between the input line and the gate of the second transistor, and
the output detection signal is responsive to a signal at the drain of the second transistor.

2. The drive circuit according to claim 1, wherein
the clamp element includes a diode,
the diode has a cathode that is connected to the gate of the second transistor, and
the diode has an anode that is connected to the output line.

3. The drive circuit according to claim 1, further comprising:
a high-side driver that drives the high-side transistor in response to a high-side control signal;
a low-side driver that drives the low-side transistor in response to a low-side control signal; and
a logic circuit that generates the high-side control signal and the low-side control signal in response to at least an input signal and the output detection signal.

4. The drive circuit according to claim 3, further comprising:
a high-side sensor that compares a gate-source voltage of the high-side transistor with a predetermined threshold level; and
a low-side sensor that compares a gate-source voltage of the low-side transistor with a predetermined threshold level, wherein
the low-side driver includes
a first current source that serves as a source of a charging current to a gate of the low-side transistor, and
a second current source that serves as a sink of a discharge current from the gate of the low-side transistor,
the first current source switches the charging current in three stages,
the logic circuit sets the charging current as a first current amount during a first period after the input signal transitions and until an output of the high-side sensor changes,
the logic circuit sets the charging current as a second current amount smaller than the first current amount during a second period after the output of the high-side sensor changes and until the output detection signal changes, and
the logic circuit sets the charging current as a third current amount larger than the first current amount and the second current amount during a third period after the output detection signal changes.

5. A motor drive device comprising:
the bridge circuit including the high-side transistor and the low-side transistor; and
the drive circuit according to claim 1, which drives the bridge circuit.

6. An electronic device comprising:
a motor; and
the motor drive device according to claim 5, which drives the motor.

* * * * *